United States Patent [19]

Scheitz et al.

[11] Patent Number: 5,597,319
[45] Date of Patent: Jan. 28, 1997

[54] ZERO INSERTION FORCE PIN GRID ARRAY SOCKET

[75] Inventors: John T. Scheitz, Barrington; Kathleen A. Capilupo, Palatine, both of Ill.

[73] Assignee: Methode Electronics, Inc., Chicago, Ill.

[21] Appl. No.: 346,546

[22] Filed: Nov. 29, 1994

[51] Int. Cl.⁶ .................................................. H01R 4/50
[52] U.S. Cl. ............................................................ 439/342
[58] Field of Search ................................. 439/342, 259, 439/845, 330, 331, 263, 264

[56] References Cited

U.S. PATENT DOCUMENTS

| | | | |
|---|---|---|---|
| 3,977,748 | 8/1976 | Gruhn et al. | 439/342 |
| 5,269,712 | 12/1993 | Denlinger et al. | 439/845 |
| 5,342,214 | 8/1994 | Hsu | 439/342 |
| 5,387,121 | 2/1995 | Kurz | 439/342 |

OTHER PUBLICATIONS

3M, Electronic Interconnection Systems: Product Selection Guide, with reference in particular to the Textool Test and Interconnect Systems at p. 15.

*Primary Examiner*—Neil Abrams
*Assistant Examiner*—Yong Kim
*Attorney, Agent, or Firm*—David L. Newman

[57] ABSTRACT

A zero insertion force pin grid array socket includes a cover slidably engaged to a base and having an array of holes formed therethrough. The base has an array of corresponding passages, the passages receiving pins of an IC package inserted through corresponding holes of the cover. Contacts are mounted within the passages and are mounted at an angle askew to the sides of the base in order to provide a high density interstitial array. The contacts include torsional beams which deflect upon the engagement of the pin of the IC package which have a surface area of at least thirty percent of the entire surface area of contacts. The contacts include a wiping area which is plated which has a surface area of less than a fortieth of the entire surface area of the contact.

19 Claims, 3 Drawing Sheets

5,597,319

1
ZERO INSERTION FORCE PIN GRID ARRAY SOCKET

BACKGROUND OF THE INVENTION

The invention relates to an electrical connector and, in particular, a zero insertion force, pin grid array socket.

Integrated circuits (ICs) have become the world's standard for electronic circuits. These range from basic transistor networks to complex memory, microprocessor and multi-chip module circuits. The common denominator to all such circuits is that they are produced en mass on a substrate such as silicon and then separated into individual units commonly known as chips. The majority of chips are then mounted in a carrier for subsequent incorporation into end products. The basic size, shape and construction of the carrier is commonly known as the package and many standard packages have emerged. Some examples are commonly known as DIP, SOJ, PLCC, QFP and PGA. Chip packages have developed to accommodate both circuit function, i.e., number and placement of leads, and assembly trends, i.e., through-board and surface mount solder assembly. While the majority of IC devices are hard soldered in place, several factors such as device availability, testing, upgrades, etc., have traditionally shown that there is a need to socket ICs regardless of their package. IC sockets are known in the art for receiving pin grid array (PGA) packages. Previous PGA sockets required a high insertion force or low insertion force. Such sockets resulted in lead damage due to the high insertion and withdrawal forces. Presently, IC packages have increasingly larger pin counts due to the continued miniaturization of the ICs. Such increased pin counts require zero insertion force (ZIF) sockets. Intel, Inc. Overdrive™ Processor Sockets are known in the art. Generally, the contacts used in these sockets are referred to as normally closed contacts. Such ZIF PGA sockets are known in the art but include complex and expensive contact designs. Such contact designs are stressed greatly as the insertion forces increase. Also, such common contact designs have large plating areas which increase cost. Accordingly, there is desired a ZIF PGA socket design which overcomes the aforementioned shortcomings.

SUMMARY OF THE INVENTION

It is, therefore, an object of the present invention to provide a socket which includes a contact design which is quickly and inexpensively manufactured.

It is another object of the present invention to provide a socket having a contact design which provides for a selective plating area.

It is a further object of the present invention to provide a socket having a contact design which provides for low stress-strain upon increase of normal force.

It is another object of the present invention to provide a contact design providing for great elastic range upon insertion.

It is a further object of the present invention to provide a contact which may be generated on a die having small centers to reduce material usage.

According to the above objects, a zero insertion force, pin grid array IC socket is provided comprising a cover slidably engaged to a base and the cover having an array of holes formed therethrough corresponding to an array of passages in said base for receiving a corresponding array of IC pins. The passages of the base including contacts having a tail portion and single unidirectionally stamped beam. The contact tails are mounted in the socket housing at a 60°–85° angle from a plane parallel to a first side of the socket. The contact includes a retention arm being bent at a 45°–90° angle to the plane of the tail. The contact includes a wipe surface and shoulders. The wipe surface is at the stamped edge of the contact.

The contact includes a continuous torsional beam having a surface area of at least forty percent of the surface area of the entire contact. The torsional beam provides for a low stress/strain force ratio.

The contact includes a wipe surface along the stamped edge or first side of the open end of the contact. This arrangement provides for a reduced selective plating area. A selective plating area includes an area less than an eightieth of the size of the entire contact.

These and other features of the invention are set forth below in the following detailed description of the presently preferred embodiments.

DETAILED DESCRIPTION OF THE PRESENTLY PREFERRED EMBODIMENTS

Figure 1:
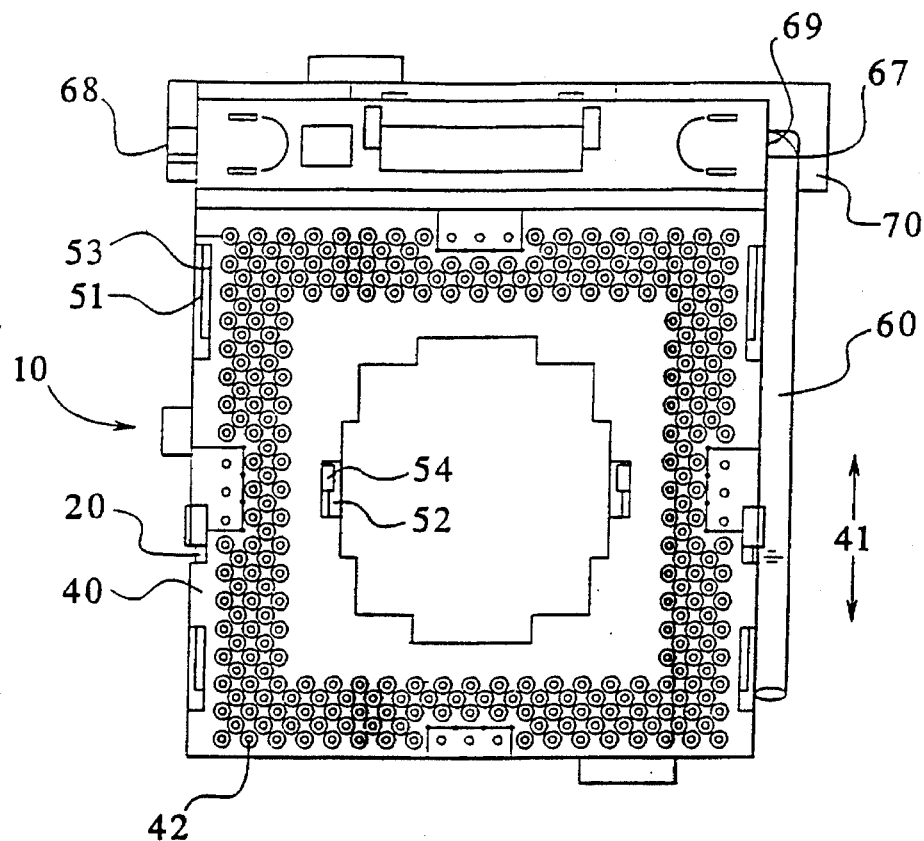
FIG. 1 is a plan view of the socket of the present invention.

An embodiment of the zero insertion force, pin grid array socket of the present invention is best understood by FIGS. 1–5. Turning to FIG. 1, socket 10 is shown having base 20 and cover 40. The cover includes an array of holes 42 for receiving pins of an IC package. The holes 42 generally are beveled in order to assist in the insertion of the pins of the IC package. The socket 10 includes actuator 60 for sliding the cover 40. By moving the actuator 60, the cover 40 will be slid in direction of arrow 41 to move the cover across the top surface of the base 20. The IC package is mounted to the socket 10 via insertion of the IC package pins through the corresponding array of holes 42 of the cover 40. The army of pins of the IC package are inserted through the array of holes 42 of the cover 40 and into the corresponding array of passages of the base 20. Due to the design of the contacts and the passages of the base 20, the insertion of the pins requires a zero insertion force. Following full insertion of the pins into the holes 42 and passages of the base 20, the actuator 60 is moved causing the cover 40 to slide, forcing the pins into their fully mated position with the contacts mounted in the passage of the base 20.

The cover 40 is mounted to the base 20 via outer latches 51 which engage hooks 53 of the base 20. As well, the cover 40 includes inner latches 52 which engage inner hooks 54. In a preferred embodiment, the latches 51, 52 are integrally molded with the cover 42 and the hooks 53, 54 are integrally molded with the base 20. While the latches 51, 52 act to retain the cover 40 onto the base 20, they also provide a means for limiting warpage of the cover 40. The IC packages which are mounted to the socket 10 can undergo great changes in heat dissipation. Such heat may cause the warpage of the socket 10. To avoid such warpage in a preferred embodiment, four outer latches 51 are oriented in each corner of the socket 10 and a pair of inner latches 52 are oriented on either side of the inner portion of the socket 10. The actuator 60 is mounted in channel 67 of the base 20. The channel 67 has an open end 68 and a closed end 69. At the closed end 69, a retaining wall 70 extends from the edge of the base 20 and is perpendicular to channel 67. A retaining wall 70 retains the actuator 60 within channels 67 upon attachment of cover 40 over the actuator 60 and onto the base 20.

Figure 2:
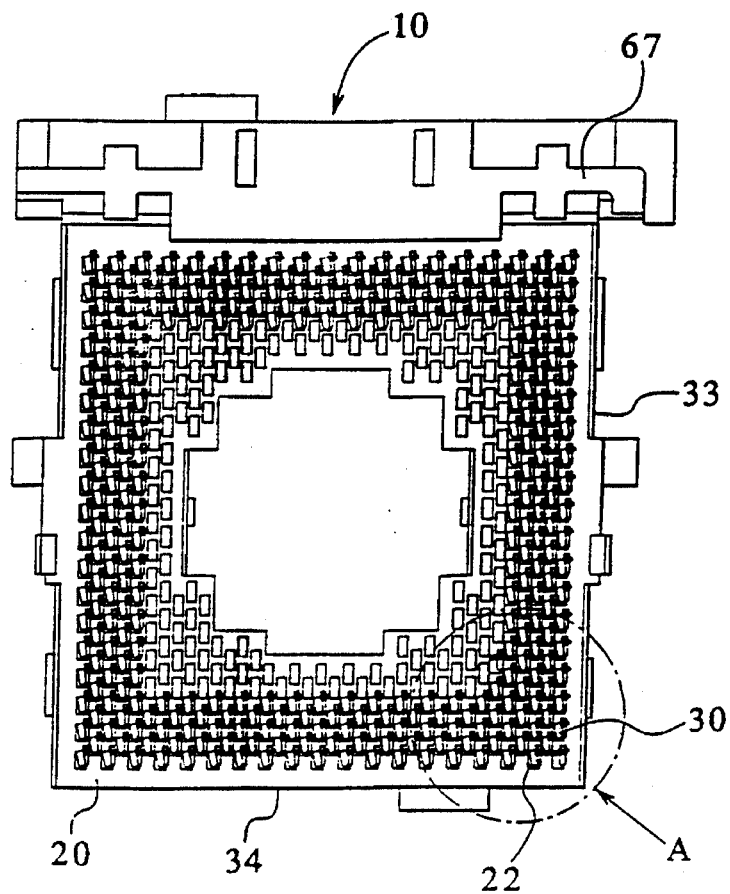
FIG. 2 is a plan view of the socket of the present invention having the cover removed.

FIG. 2 is a plan view of the socket 10 having the cover removed. The base 20 is shown having an array of passages 22. The base 20 includes a first side 33 which is perpendicular to the channel 67 and a second side 34 which is parallel to the channel 67. Contacts 30 are mounted in passages 22. It can be seen that while the passages 22 are generally parallel to the first side 33 of the base 20, the tails 38 are mounted at a 60°–85° angle to the first side 33. Channel 67 is shown having the actuator removed. In a preferred embodiment, the socket 10 houses approximately three hundred and twenty (320) contacts being interstitially spaced on a 0.100 inch×0.100 inch grid. Generally, the socket 10 has an overall dimension of 2 inches×2.420 inch×5/16 inch. In a preferred embodiment, the housing of the cover and base are injection molded from a polymeric material.

Figure 3:
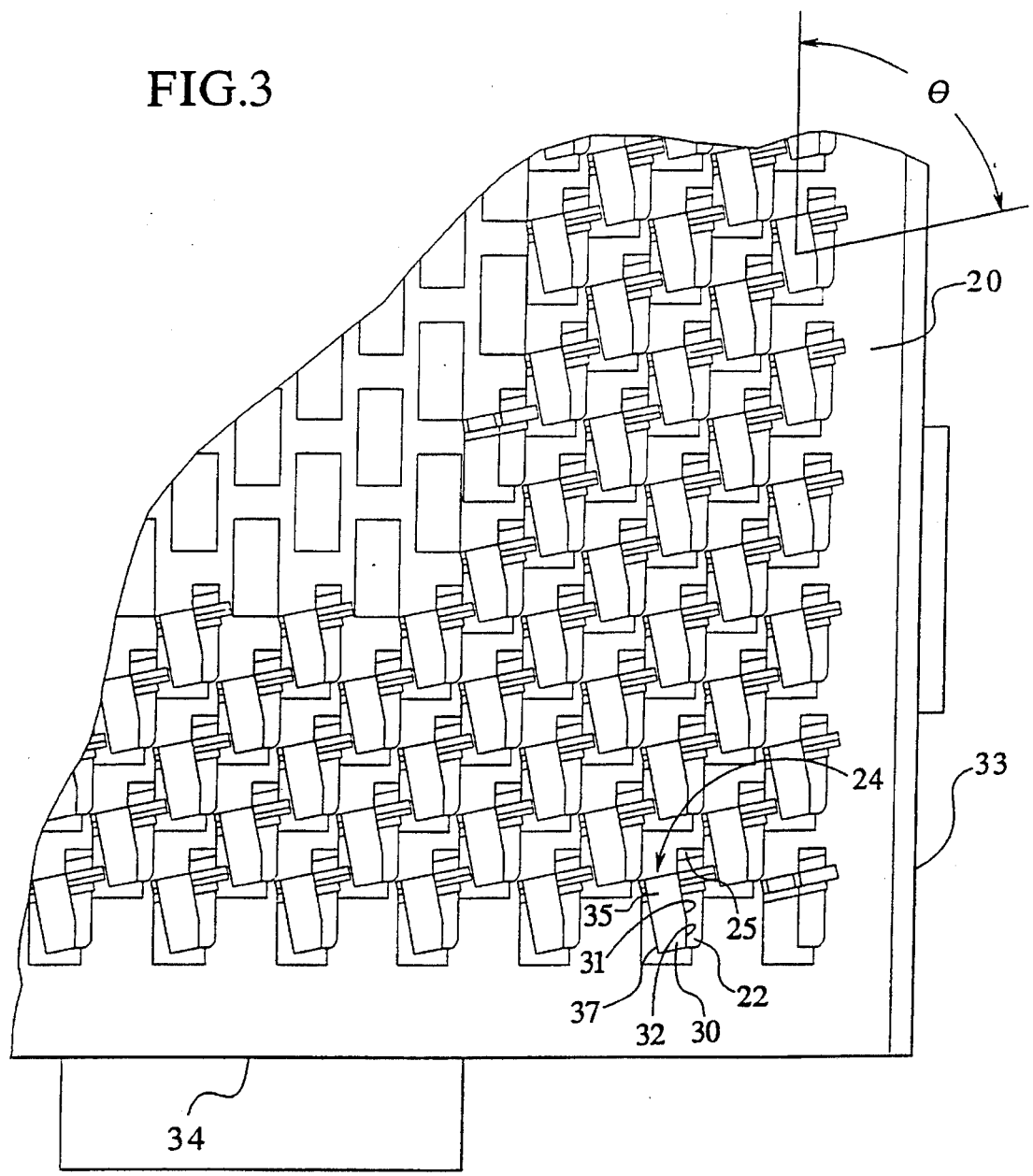
FIG. 3 is an enlarged plan view of Area A of the socket of FIG. 2.

Turning to FIG. 3, an enlarged plan view of Section A of FIG. 2 is shown. Base 20 includes passages 22 having contacts 30 mounted therein. Upon initial insertion of the pins of an IC package, the pins are inserted through the cover and are received in zero insertion force pocket 25. The zero insertion force pocket 25 has dimensions greater than the diameter of the pin of the IC package. The pin is then slid in direction of arrow 24 and is moved from zero insertion force pocket 25 into the portion of the passage 22 adjacent the contact 30 via the movement of the cover. The pin first contacts shoulder 31 of the retention arm 35 of contacts 30. The pin then continues past shoulder 31 to arrive in its fully mated position against wipe area 32. The base 20 includes a first side 33 and a second side 34. While the passages 22 have walls which are generally perpendicular and parallel to first and second sides 33, 34, the contacts 30 are mounted within the passages 22 at a skewed angle Θ. Generally, angle Θ is an angle between 60°–85° from the first side 33. The mounting of the contacts 30 at an angle allow for the high density arrangement of the passages 22 and contacts 30 of the present invention.

Figure 4:
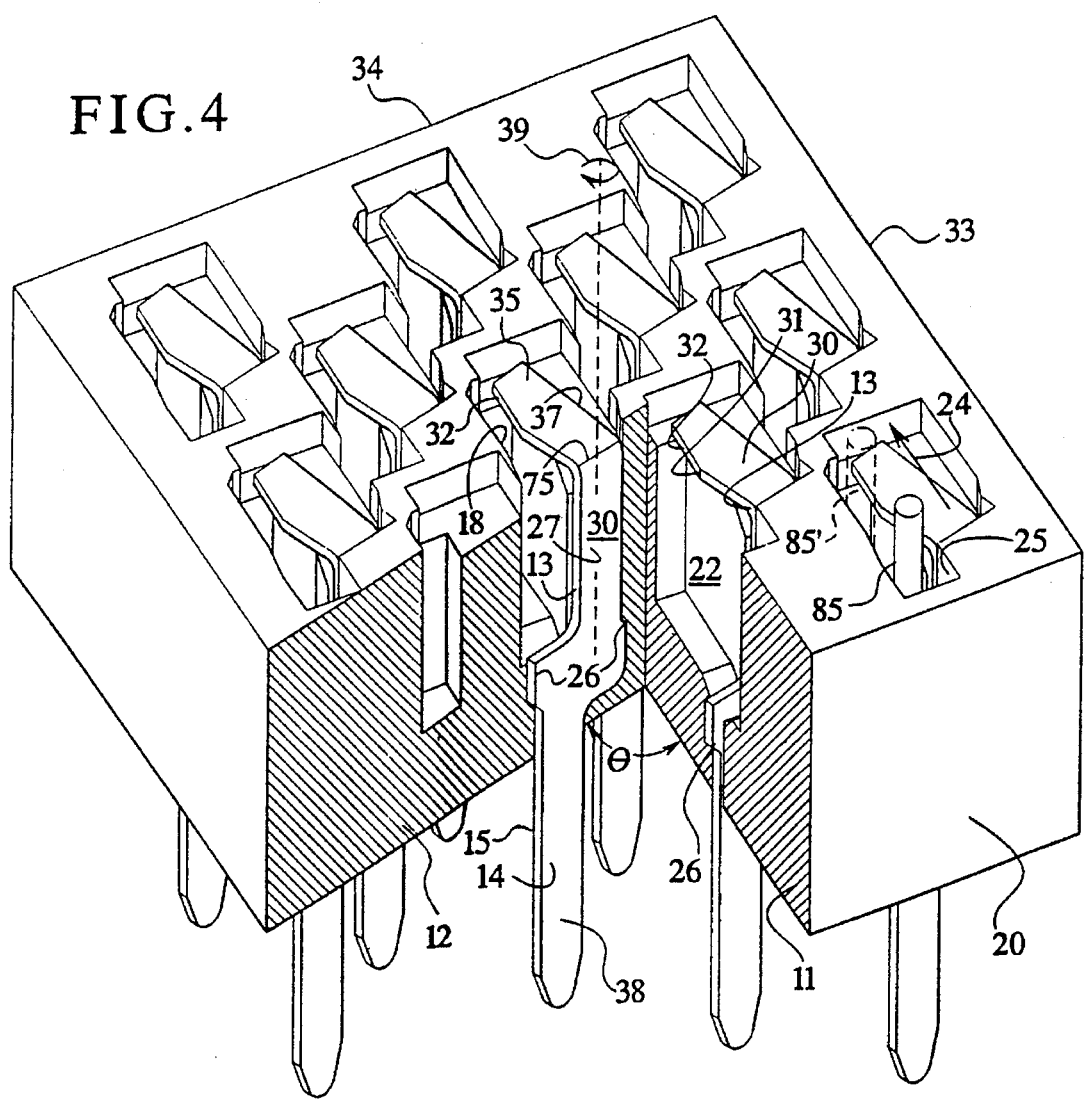
FIG. 4 is a perspective view of the socket of FIG. 3, partially cut-away.

Turning to FIG. 4, a perspective view of an enlarged section of the base 20 is shown having a cut-away section exposing the passages 22 and contacts 30. A first side 33 and second side 34 of the base 20 are shown. The cut-away was taken forming a first wall 11 and a second wall 12. The first wall 11 is parallel with first side 33. The second wall 12 is parallel with the mounting angle of the tail 38 of the contacts 30. First wall 11 and second wall 12 form angle Θ. Generally, angle Θ is between 60°–85°. In a preferred embodiment, the contacts 30 are mounted having tail 38 at an angle of 75° to the first side 33. A pin 85 of an IC package is inserted in zero insertion pocket 25. As shown, the diameter of the pin 85 is less than the dimensions of the zero insertion force pocket 25 and therefore requires zero insertion force. The pin 85 is moved in direction of arrow 24, parallel to first side 33, when the cover is slid due to the movement of the actuator (as shown in FIG. 1). The pin 85 slides along the stamped edge 13 and engages shoulder 31 of the contacts 30. The pin 85 then is slid past to wipe area 32. The pin 85 reaches its fully mated position, as shown by pin 85'.

The contacts 30 include tail 38 and torsional beam 27. The tail 38 and torsional beam 27 are formed in a unitary plane. The contacts 30 are mounted in the base 20 at an angle Θ to the first side 33. The unitary plane of the tail 38 and torsional beam 27 is at angle Θ which is benerally 60°-85° from the first side 33. However, angle Θ may be any skewed angle or an angle which is not parallel or perpendicular to the first side 33 which allows for a high density arrangement of passages 22 and contacts 30. In a preferred embodiment, the contacts 30 are mounted at an angle of 75° to the first side 33. The contacts 30 include retention arm 35. The retention arm 35 is bent at approximately a 45°–90° angle to the plane of the tail 38 and torsional beam 27. The positioning of the retention arm 35 at other than a 90° angle may allow for overlapping mounting of contacts 30 for even tighter spacing than shown in FIG. 4. As mentioned earlier, the contacts 30 include a wiping area 32 along the stamped edge 13 of a retention arm 35. Opposite the wiping area 32, is a nonwiping side 37 of the contacts 30. The nonwiping side 37 is also offset at an angle to the first side 33 of the base 20 (also see FIG. 3). As the retention arm 35 is bent at approximately a 45°–90° angle to the plane of the tail 38 and torsional beam 27, the nonwiping side 37 will be offset approximately 90° from the angle Θ at which the tail 38 is mounted within base 20. As wiping surface 32 is not parallel with nonwiping side 37, the angle of the wiping surface is skewed from all other stamped edges 13. The present design of the contacts 30 and their placement at an angle within the base 20, allows for the dense spacing which is required for the present interstitial footprint of the base 20 and the high pin count of the IC package which is received therein. The contacts 30 also include wings 26 for providing a friction fit of the contacts within passages 22.

Generally, contacts 30 are a stamped contact of a copper alloy. The contact is stamped on a die in a unitary plane. The unitary plane is that of the tail 38 and torsional beam 27. The stock that the contacts 30 are stamped from, in a preferred embodiment, has a stamped edge 13 which generally has a thickness of 0.006 inch and a wipe area 32 which is approximately 0.030 inches long, providing a total wiping surface area of 0.00018 square inches compared to the total contact surface area which is 0.0082 square inches or approximately forty-five times the wiping surface area. This small wiping area allows for selective plating of a small area of the contacts 30. Prior to the forming of the retention arm 35 at approximately a 45°–90° angle, the contact in its unitary plane is plated at this selective wiping area 32 or target area. A method of forming the socket includes preparing a plurality of contacts in a unitary plane plated generally at the selective wiping area 33. It can be seen that the overall design of this contact allows for a great reduction in the plating materials required for the contacts 30. In a preferred embodiment, gold plating is adhered to wipe areas 32 and due to the small area, the plating costs are greatly reduced. Such plating techniques may include mask plating or controlled depth plating Such plating techniques may be applied either before or after bending of the retention arm 35. As well, the contact design of the present invention allows for the contacts to be spaced on the die on 0.100 inch spacing so that they may be quickly and easily inserted into the passages 22 of the base 20 and providing for minimal material usage.

The IC package pin 85 is initially inserted into the zero insertion force pocket 25 and is then slid in direction of arrow 24, sliding past shoulder 31. At this point of insertion, the greatest amount of force is received by the contacts 30. Because retention arm 35 is a unitary member with the entire torsional beam 27, the entire force received at shoulder 31 is spread along the entire length of the torsional beam 27. The force of the pin 85 against shoulder 31 causes the torsional beam 27 including the retention arm 35 to deflect in a torsional manner in direction of arrow 39. The torsional beam 27 of the contacts 30 receives this torsional deflection upon insertion of the pin 85.

The present contact design provides for the contact being stamped from a sheet of material having a narrow Z dimension or thickness or stamped edge 13. The rolled surface of the material is of sufficient width and length for the X-Y dimensions of the contact define a second side 14 and a third side 15. The retention arm 35 is bent at an angle to the second side 14 or third side 15 of the contacts 30. Such bending along the relatively lengthy crease 75, as compared to the thickness of first side 13, provides for a large surface area of the contacts 30 for the torsional motion 39 induced by the normal force of pin 85 to be transferred beyond the retention arm 35 and to the entire torsional beam 27. Such torsional beam 27 provides for the advantages of the present invention of a low stress/strain force ratio and a great elastic range, as compared to the straight cantilever designs of the prior art. Due to the dispersion of the normal force of the pin 85 of the present invention along the entire torsional beam 27 length, the stress-strain measurement is lessened for this contact design. Thus, the torsional beam 27 having a surface area of at least forty percent of the entire contact surface area, provide for greater elastic range than the contacts of the prior art, while maintaining sufficient normal forces.

After the pin 85 is slid passed shoulder 31 of the retention arm 35, it attains its final mating position against wiping area 32. Pin 85' is shown in a final mated position between wiping area 32 of the retention arm 35 of the contacts 30 and partition 18 of passages 22 which provide a sufficient normal force to hold the pin 85 therein. Prior art contacts do not have the advantage of the contact of the present invention in that insertion forces are not deflected throughout the majority of the contact surfaces and selective plating of small areas cannot be undertaken.

Figure 5:
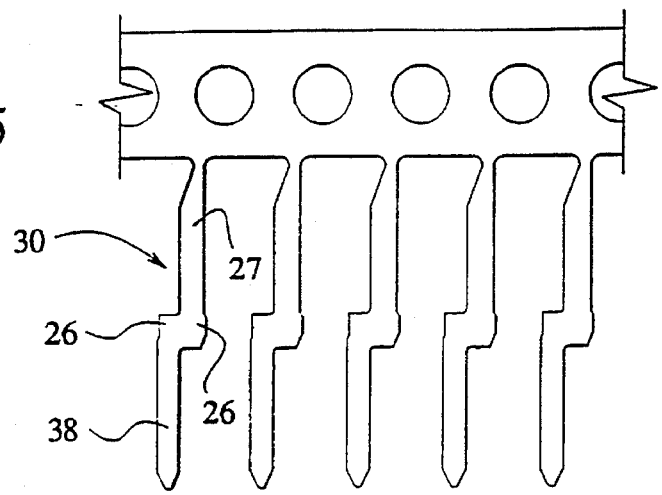
FIG. 5 is a plan view of the contact of the present invention prior to insertion.

Turning to FIG. 5, the contacts 30 are shown after stamping prior to insertion in the base 20 of the socket. The contacts 30 include tail 38 and torsional beam 27. Wings 26, 26 help retain the contacts 30 via press-fit within the base 20. It can be observed that the present contact design allows for the quick stamping and insertion of the contacts within the base 20.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A zero insertion force pin grid array socket comprising:
    a cover having an array of holes formed therethrough slidably engaged to a base; said base having a first side and a corresponding array of passages to said holes, said holes and corresponding passages for receiving pins of an IC package; and
    contacts mounted in said passages including a tail at a first end and a torsional beam at the opposite end, said contacts mounted within said base having said tail mounted at an angle of 60°–85° to said first side of said base.

2. The socket of claim 1 wherein said contact receives plating at a wiping area and the entire surface area of said contact being at least forty times the surface area of said wiping area.

3. The socket of claim 1 wherein said torsional beam has a total surface area of at least thirty percent of the entire surface area of said contact.

4. The socket of claim 1 wherein said wiping area is at a stamped edge of said contacts.

5. The socket of claim 1 wherein a shoulder of said contact is at a stamped edge of said contacts.

6. The socket of claim 1 including zero insertion force pockets adjacent to said passages.

7. The socket of claim 1 wherein a fin insertion path of said pins is parallel to a wiping area of the said contact.

8. The socket of claim 1 wherein the contact includes a retention arm at a 45°–90° angle to the plane of said torsional beam and contact tail.

9. A zero insertion force, pin grid array socket comprising:
    a cover slidably engaged to a base and having an array of holes formed therethrough;
    said base having a corresponding array of passages to said holes, said holes and corresponding passages for receiving pins of an IC package and said base having a first side; and
    contacts mounted in said passages, the contacts forming a 0.100×0.100 inch grid pattern having the contacts generally forming horizontal and vertical lines forming squares and additional contacts interstitially placed at the approximate center of the squares, the contacts including a tail at a first end and a torsional beam at the opposite end having said tail mounted within said base oblique to the first side of the base.

10. The socket of claim 9 wherein said contact is mounted at an angle of 60°–85° to a first side of said base.

11. The socket of claim 9 wherein said torsional beam includes a retention arm at an angle of 45°–90° to the plane of said contact tail.

12. The socket of claim 9 wherein said torsional beam includes a retention arm having a wiping area, the entire surface area of said contacts being at least forty times of the surface area of said wiping area.

13. The socket of claim 9 wherein a retention arm forms a crease on the contact having a length greater than the thickness of said contact.

14. A method of forming a zero insertion force, pin grid array socket including the steps of:
    molding a cover slidably engageable to a base and having an array of holes formed therethrough;
    molding said base having a corresponding array of passages to said holes;
    stamping a plurality of contacts on 0.100 inch spacing including torsional beams having a wiping area;
    plating said wiping area; and
    inserting said contacts in said passages.

15. The method of claim 14 wherein wiping area has a surface area of less than a fiftieth of the surface area of said contact.

16. The method of claim 14 wherein said torsional beam has a surface area of at least thirty percent of said contact surface area.

17. The method of claim 14 wherein said contacts create a normal force through torsional movement of said torsional beam.

18. The method of claim 14 wherein said plating step includes selective plating of said wiping area.

19. The method of claim 14 wherein said plating step includes spot plating of said wiping area.

* * * * *

UNITED STATES PATENT AND TRADEMARK OFFICE
CERTIFICATE OF CORRECTION

PATENT NO. : 5,597,319
DATED : January 28, 1997
INVENTOR(S) : John T. Schietz, et al It is certified that error appears in the above-identified patent and that said Letters Patent is hereby corrected as shown below:

IN THE CLAIMS:

Correct typographical error in Claim 7 as follows:

7. The socket of claim 1 wherein [a fin] an insertion path of said pins is parallel to a wiping area of the said contact.

Signed and Sealed this

First Day of April, 1997

Attest:

Attesting Officer

BRUCE LEHMAN

Commissioner of Patents and Trademarks